United States Patent
Kunimoto et al.

(10) Patent No.: US 11,322,659 B2
(45) Date of Patent: May 3, 2022

(54) METHOD FOR MANUFACTURING WAVELENGTH CONVERSION MEMBER, WAVELENGTH CONVERSION MEMBER, AND LIGHT-EMITTING DEVICE

(71) Applicant: NIPPON ELECTRIC GLASS CO., LTD., Otsu (JP)

(72) Inventors: Tomomichi Kunimoto, Otsu (JP); Hideki Asano, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 17/022,359

(22) Filed: Sep. 16, 2020

(65) Prior Publication Data

US 2020/0411729 A1    Dec. 31, 2020

Related U.S. Application Data

(62) Division of application No. 16/347,285, filed as application No. PCT/JP2017/041765 on Nov. 21, 2017, now Pat. No. 10,818,825.

(30) Foreign Application Priority Data

Dec. 9, 2016  (JP) ................................. 2016-239326

(51) Int. Cl.
*H01L 33/50* (2010.01)
*G02B 5/20* (2006.01)
*C09K 11/08* (2006.01)

(52) U.S. Cl.
CPC ............ *H01L 33/501* (2013.01); *C09K 11/08* (2013.01); *G02B 5/20* (2013.01); *H01L 33/50* (2013.01); *H01L 2933/0041* (2013.01)

(58) Field of Classification Search
CPC ................... H01L 33/50; H01L 33/501; H01L 2933/0041; C09K 11/08; G02B 5/20
(Continued)

(56) References Cited

U.S. PATENT DOCUMENTS

2004/0086688 A1    5/2004  Hirano et al.
2010/0264438 A1   10/2010  Suenaga
(Continued)

FOREIGN PATENT DOCUMENTS

CN    1480417 A    3/2004
CN  101099228 A    1/2008
(Continued)

OTHER PUBLICATIONS

Official Communication issued in corresponding Chinese Patent Application No. 201780075652.3, dated Nov. 3, 2020.
(Continued)

*Primary Examiner* — Matthew E Warren
(74) *Attorney, Agent, or Firm* — Keating and Bennett, LLP

(57) ABSTRACT

Provided are a method for manufacturing wavelength conversion members that enables manufacturing of wavelength conversion members having a high light extraction efficiency and suppression of material loss, a wavelength conversion member obtained by the method, and a light-emitting device. A method for manufacturing a plurality of wavelength conversion members by breaking into parts a base material 10 for the wavelength conversion members includes the steps of: preparing the base material 10 having a first principal surface 11 and a second principal surface 12 opposed to each other; forming a breaking groove 13 in the first principal surface 11; bonding a support 20 to the second principal surface 12 of the base material 10 having the breaking groove 13 formed in the first principal surface 11;
(Continued)

pressing through the support 20 a region of the base material 10 where the breaking groove 13 is formed, thus breaking the base material 10 into the plurality of wavelength conversion members along the breaking groove 13; expanding the support 20 to form a gap between the plurality of wavelength conversion members lying on the support 20; and removing the plurality of wavelength conversion members from the support 20 after forming the gap.

7 Claims, 7 Drawing Sheets

(58) Field of Classification Search
USPC .......................................................... 257/98
See application file for complete search history.

(56) References Cited

U.S. PATENT DOCUMENTS

| | | |
|---|---|---|
| 2013/0056781 A1 | 3/2013 | Suenaga |
| 2013/0140592 A1* | 6/2013 | Lee ................... H01L 33/0095 257/98 |
| 2013/0174610 A1 | 7/2013 | Teranishi et al. |
| 2013/0313602 A1 | 11/2013 | Suenaga |
| 2014/0339573 A1* | 11/2014 | Zimmerman ......... H01L 33/641 257/88 |
| 2014/0367729 A1 | 12/2014 | Ebe et al. |
| 2015/0280065 A1 | 10/2015 | Wada |
| 2016/0093777 A1* | 3/2016 | Sato ................... H01L 25/167 257/98 |
| 2016/0155912 A1 | 6/2016 | Burger et al. |
| 2016/0315231 A1 | 10/2016 | Göötz et al. |
| 2017/0271564 A1 | 9/2017 | Kim et al. |
| 2018/0145231 A1 | 5/2018 | Fujii et al. |
| 2018/0277725 A1 | 9/2018 | Xiong et al. |
| 2018/0309034 A1 | 10/2018 | Ooyabu et al. |
| 2019/0348587 A1 | 11/2019 | Ooyabu et al. |

FOREIGN PATENT DOCUMENTS

| | | |
|---|---|---|
| CN | 101867003 A | 10/2010 |
| CN | 103635438 A | 3/2014 |
| CN | 105006510 A | 10/2015 |
| CN | 105047786 A | 11/2015 |
| CN | 105453281 A | 3/2016 |
| EP | 2 503 606 A2 | 9/2012 |
| EP | 2 680 327 A3 | 1/2014 |
| EP | 2 680 328 A2 | 1/2014 |
| EP | 2 680 329 A2 | 1/2014 |
| JP | 2004-221536 A | 8/2004 |
| JP | 2010-272847 A | 12/2010 |
| JP | 2011-068542 A | 4/2011 |
| JP | 2016-119402 A | 6/2016 |
| KR | 10-2016-0023052 A | 3/2016 |
| WO | 2006/073098 A1 | 7/2006 |
| WO | 2013/018279 A1 | 2/2013 |
| WO | 2016/148019 A1 | 9/2016 |
| WO | 2016/194746 A1 | 12/2016 |

OTHER PUBLICATIONS

Kunimoto et al., "Method for Manufacturing Wavelength Conversion Member, Wavelength Conversion Member, and Light-Emitting Device", U.S. Appl. No. 16/347,285, filed May 3, 2019.
Official Communication issued in corresponding European Patent Application No. 17878412.0, dated Mar. 11, 2022.

* cited by examiner

[FIG. 1]
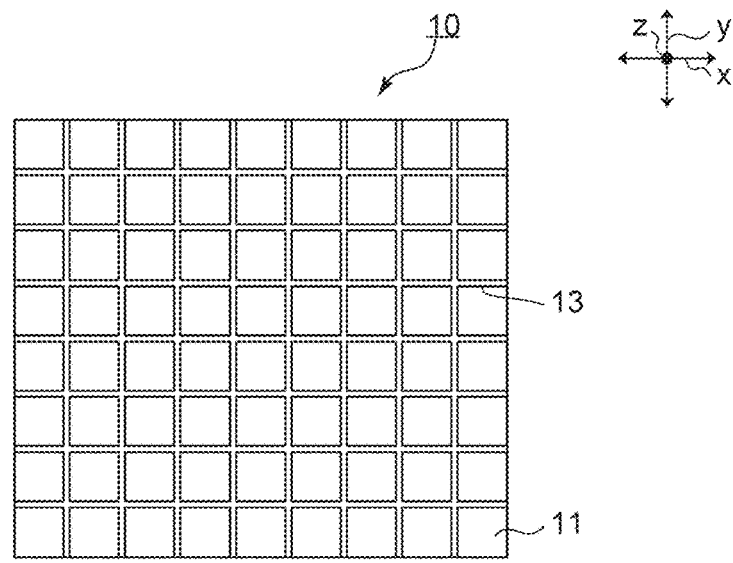
[FIG. 2]
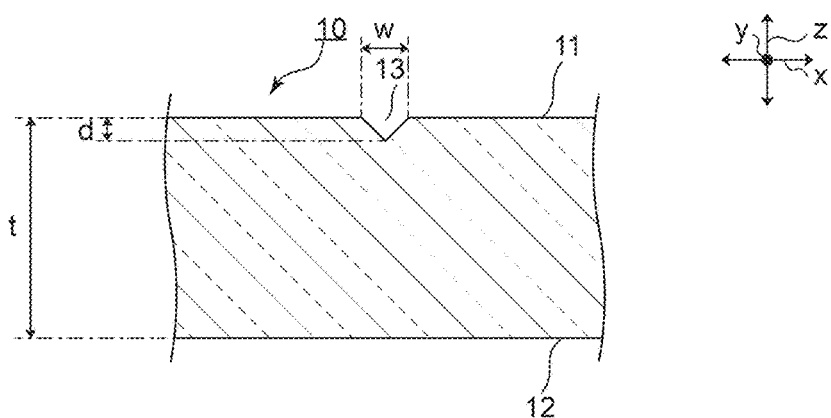
[FIG. 3]
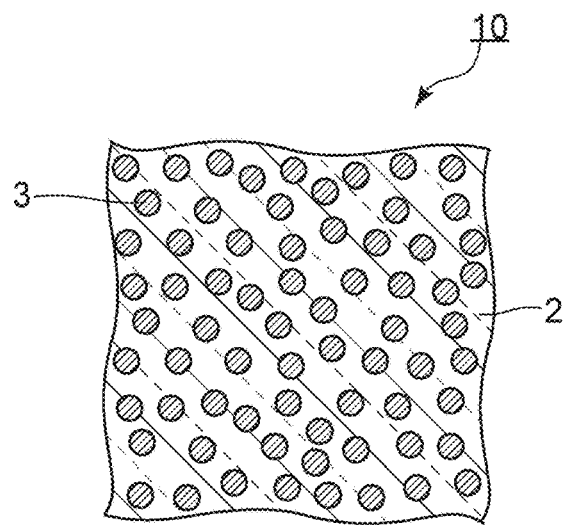

[FIG. 4]
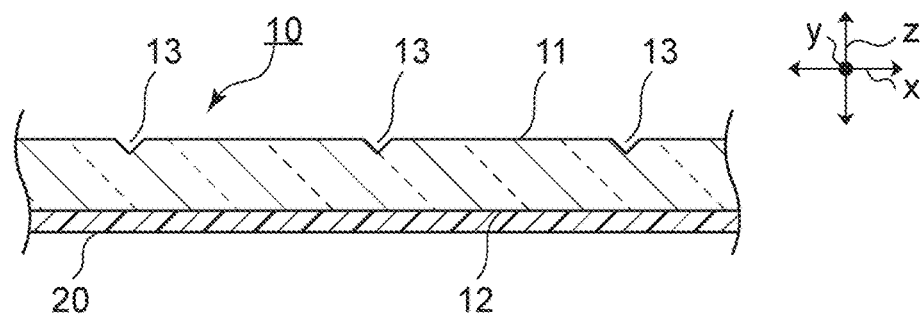
[FIG. 5]
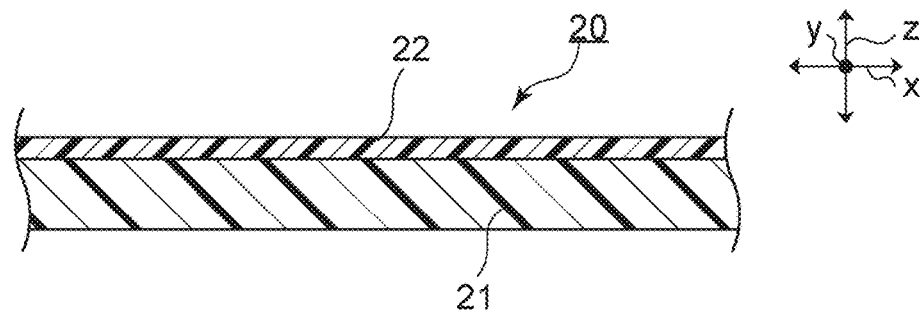

[FIG. 6]
(a)
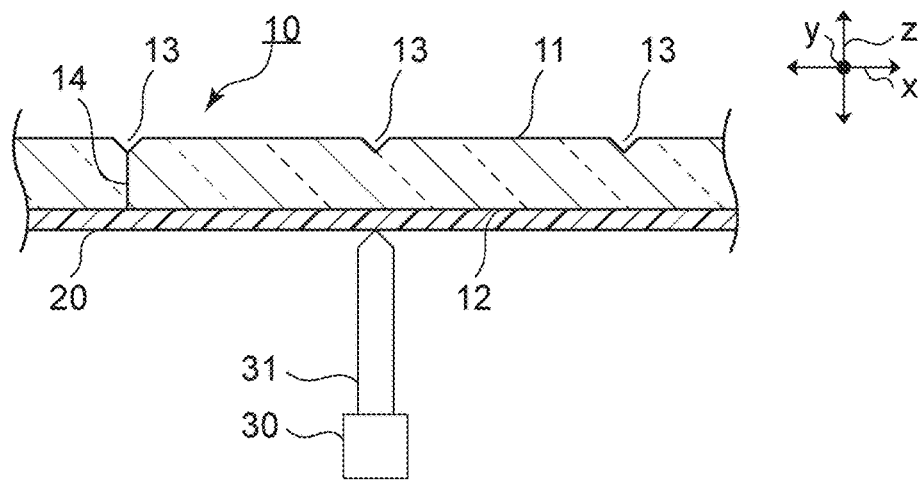
(b)
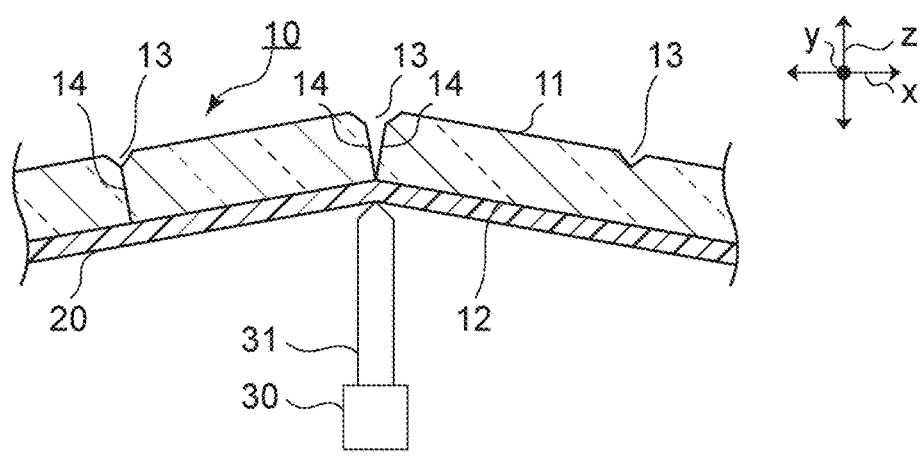
(c)
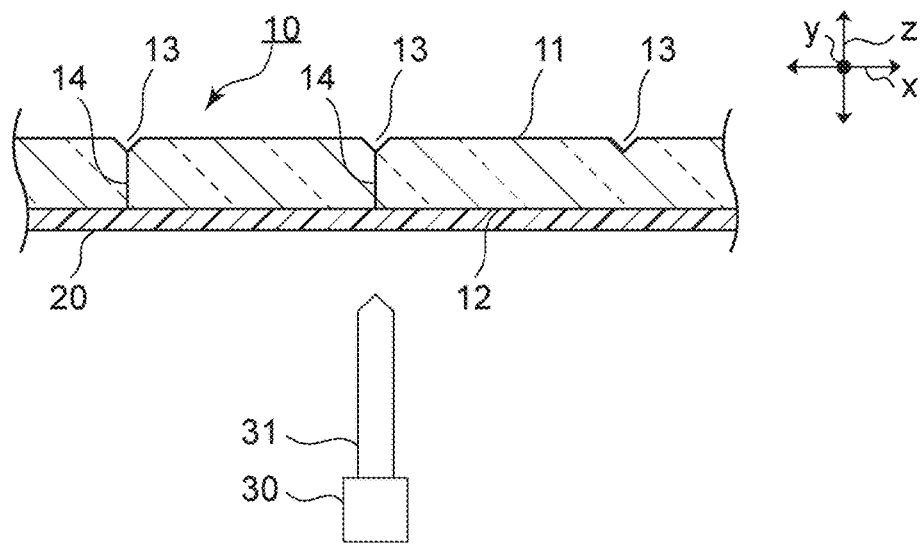

[FIG. 7]
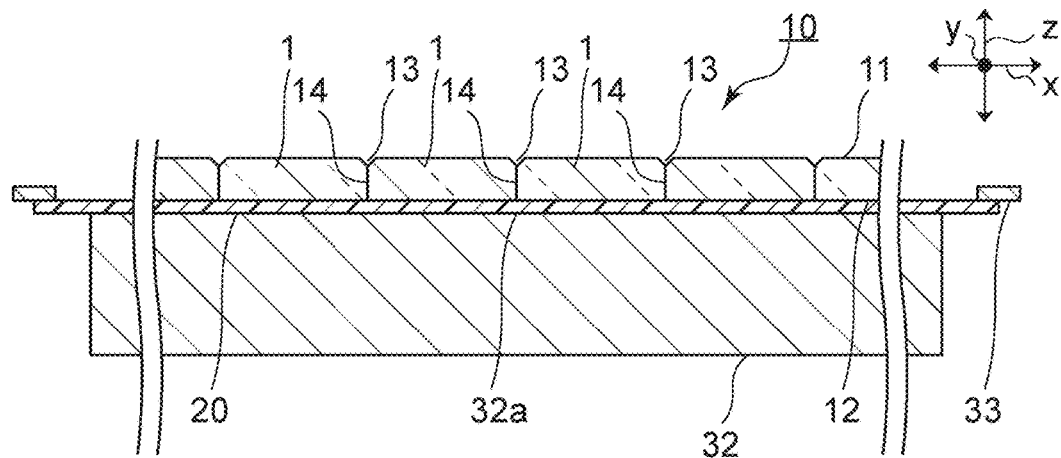
[FIG. 8]
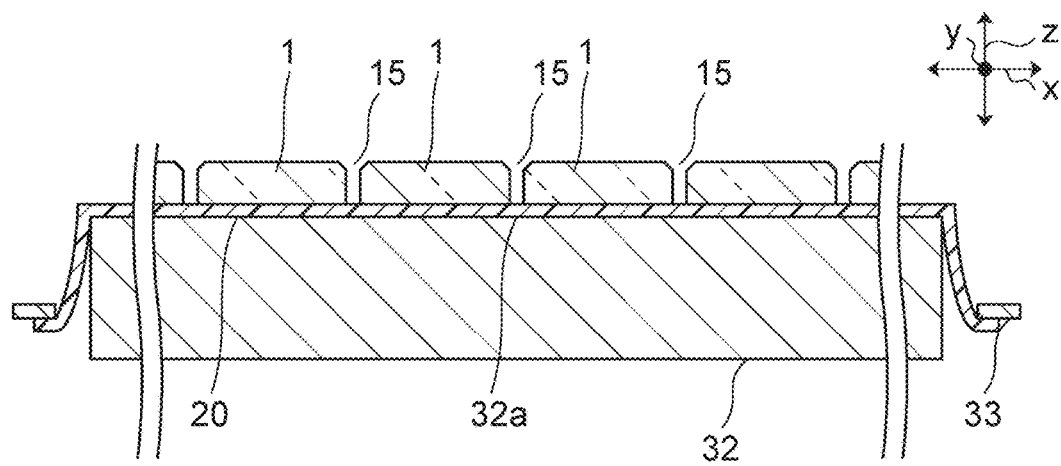
[FIG. 9]
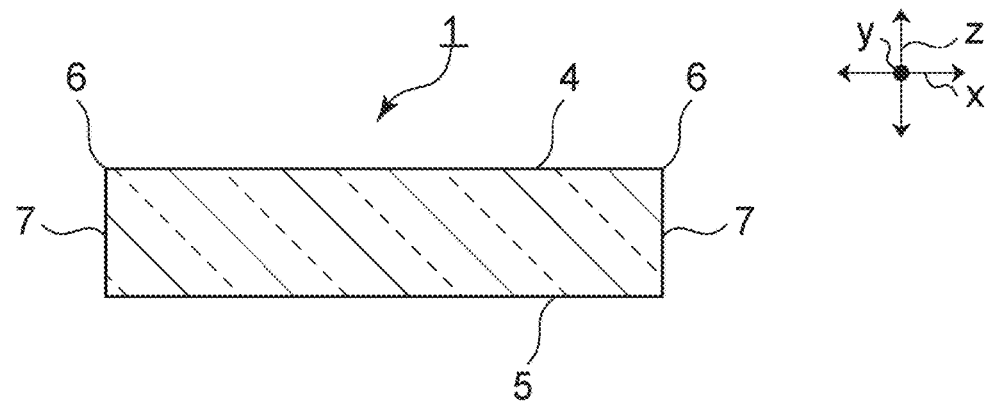

[FIG. 10]
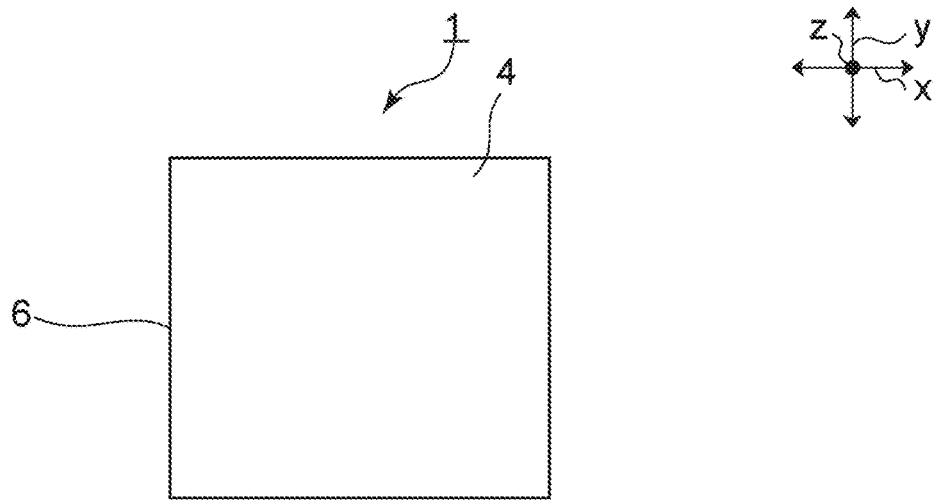
[FIG. 11]
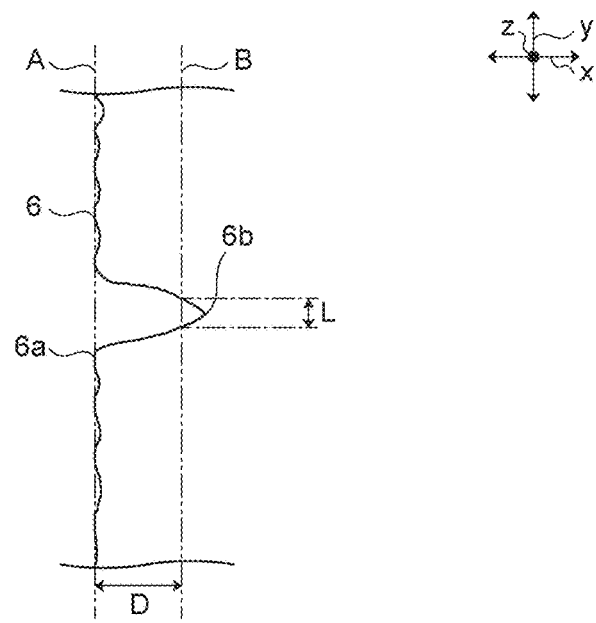
[FIG. 12]
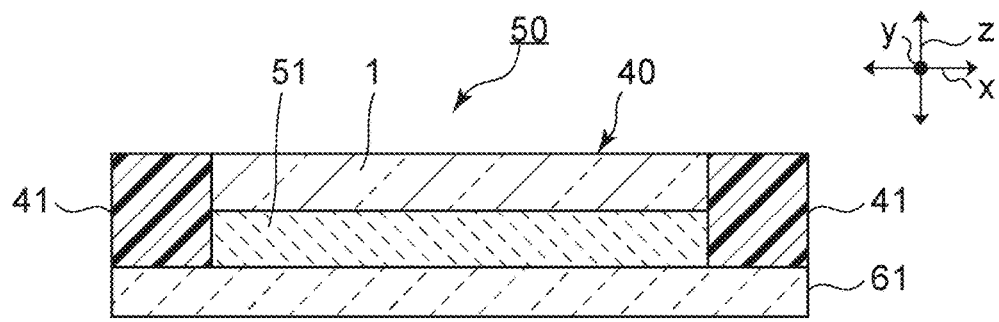

[FIG. 13]
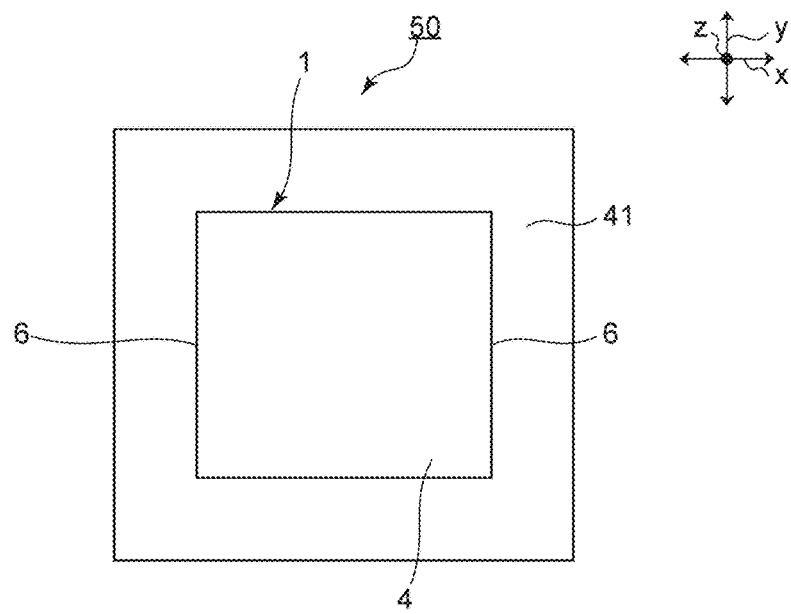
[FIG. 14]
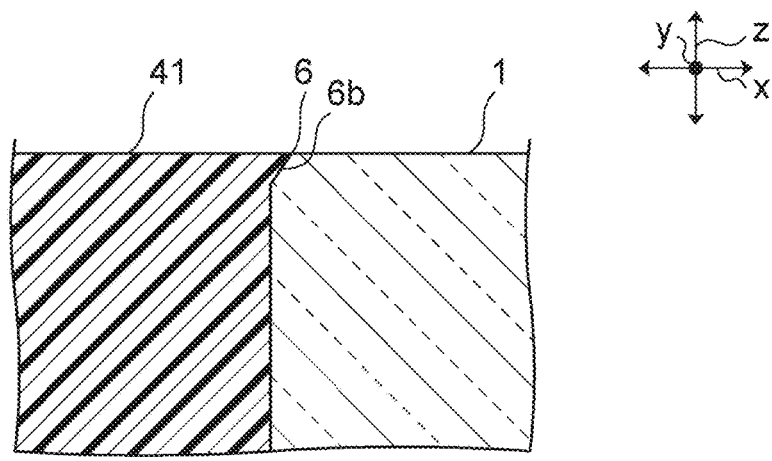
[FIG. 15]
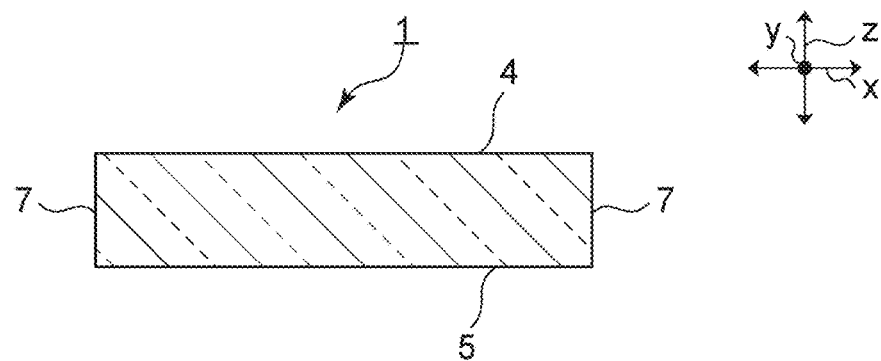

[FIG. 16]
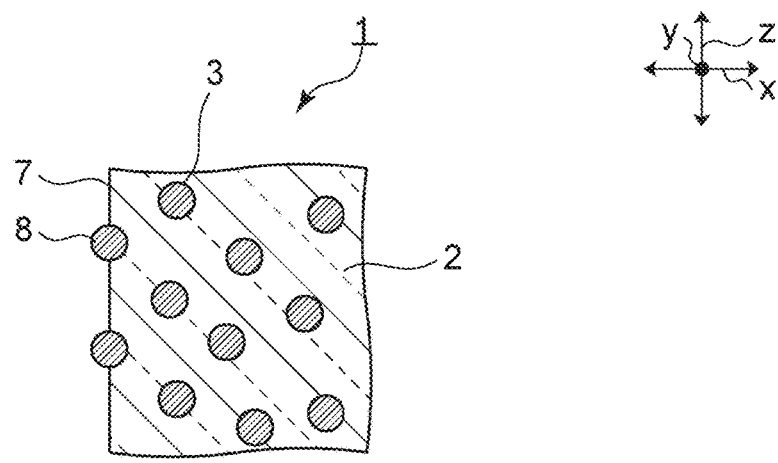
[FIG. 17]
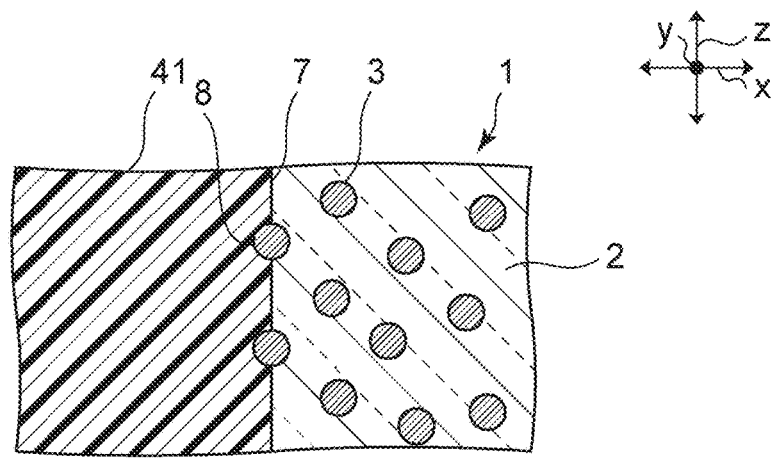

METHOD FOR MANUFACTURING WAVELENGTH CONVERSION MEMBER, WAVELENGTH CONVERSION MEMBER, AND LIGHT-EMITTING DEVICE

TECHNICAL FIELD

The present invention relates to methods for manufacturing wavelength conversion members, wavelength conversion members, and light-emitting devices.

BACKGROUND ART

Recently, attention has been increasingly focused on light-emitting devices and the like using LEDs or LDs, as next-generation light sources to replace fluorescence lamps and incandescent lamps. As an example of such a next-generation light source, there is a disclosure of a light-emitting device in which an LED for emitting a blue light is combined with a wavelength conversion member capable of absorbing part of the light from the LED to convert it to a yellow light. This light-emitting device emits a white light which is a synthesized light of the blue light emitted from the LED and having passed through the wavelength conversion member and the yellow light emitted from the wavelength conversion member. Patent Literature 1 proposes, as an example of a wavelength conversion member, a wavelength conversion member in which phosphor powder is dispersed in a glass matrix.

Patent Literature 2 discloses a method for manufacturing wavelength conversion members by dividing a base material for the wavelength conversion members by dicing.

CITATION LIST

Patent Literature

[PTL 1]
JP-A-2003-258308
[PTL 2]
JP-A-2011-238778

SUMMARY OF INVENTION

Technical Problem

The inventors found that division of a base material by dicing as in Patent Literature 2 presents a problem that chipping occurs in the surfaces of wavelength conversion members, so that the light extraction efficiency of the wavelength conversion members decreases. Furthermore, there is also a problem that dicing causes material loss.

An object of the present invention is to provide a method for manufacturing wavelength conversion members that enables manufacturing of wavelength conversion members having a high light extraction efficiency and suppression of material loss, a wavelength conversion member obtained by the method, and a light-emitting device.

Solution to Problem

A manufacturing method according to the present invention is a method for manufacturing a plurality of wavelength conversion members by breaking into parts a base material for the wavelength conversion members and includes the steps of: preparing the base material having a first principal surface and a second principal surface opposed to each other; forming a breaking groove in the first principal surface; bonding a support to the second principal surface of the base material having the breaking groove formed in the first principal surface; pressing through the support a region of the base material where the breaking groove is formed, thus breaking the base material into the plurality of wavelength conversion members along the breaking groove; expanding the support to form a gap between the plurality of wavelength conversion members lying on the support; and removing the plurality of wavelength conversion members from the support after forming the gap.

The breaking groove is preferably formed by scribing.

The support is preferably expanded by pressing from a side of the support opposite to the base material.

It is preferred that an adhesive layer made of an ultraviolet curable resin be formed on a surface of the support and the second principal surface be bonded to the adhesive layer. In this case, it is preferred that after the adhesive layer is irradiated with ultraviolet rays to decrease adhesiveness of the adhesive layer, the plurality of wavelength conversion members be removed from the support.

The base material is preferably broken into parts by using a pressing member with a blade to press the blade against a portion of the support opposed to the breaking groove.

The base material is preferably formed to have phosphor particles dispersed in an inorganic matrix. In this case, the inorganic matrix is preferably a glass.

A wavelength conversion member according to the present invention is a wavelength conversion member having a first principal surface and a second principal surface opposed to each other and has a scribe line formed on a periphery of the first principal surface.

A wavelength conversion member according to the present invention is a wavelength conversion member having a first principal surface and a second principal surface opposed to each other, wherein a missing portion in a periphery of the first principal surface makes up 10% or less of the entire periphery.

The wavelength conversion member is preferably a wavelength conversion member in which phosphor particles are dispersed in an inorganic matrix.

A wavelength conversion member according to the present invention is a wavelength conversion member that has a first principal surface and a second principal surface opposed to each other and contains phosphor particles dispersed in an inorganic matrix, wherein a convex portion is formed by the phosphor particle on a side surface of the wavelength conversion member connecting between the first principal surface and the second principal surface.

The inorganic matrix is preferably a glass.

A light-emitting device according to the present invention includes: the wavelength conversion member according to the present invention; a light source provided toward the second principal surface of the wavelength conversion member and capable of irradiating the wavelength conversion member with excitation light; and a reflective member provided around a side surface of the wavelength conversion member connecting between the first principal surface and the second principal surface.

The reflective member is preferably made of a resin composition containing a white pigment.

Advantageous Effects of Invention

The manufacturing method according to the present invention enables manufacturing of wavelength conversion members having a high light extraction efficiency and enables suppression of material loss.

The wavelength conversion member and light-emitting device according to the present invention have a high light extraction efficiency.

BRIEF DESCRIPTION OF DRAWINGS

FIG. 1 is a plan view showing a base material in which breaking grooves are formed in one embodiment of a manufacturing method according to the present invention.

FIG. 2 is a cross-sectional view showing on an enlarged scale the breaking groove shown in FIG. 1.

FIG. 3 is an enlarged cross-sectional view showing phosphor particles and an inorganic matrix both forming the base material in the one embodiment of the manufacturing method according to the present invention.

FIG. 4 is a cross-sectional view showing a state where a support is bonded to a second principal surface of the base material in the one embodiment of the manufacturing method according to the present invention.

FIG. 5 is a cross-sectional view for illustrating the structure of the support.

FIG. 6 is cross-sectional views for illustrating the step of pressing through the support a region of the base material where the breaking groove is formed, thus breaking the base material.

FIG. 7 is a cross-sectional view for illustrating the step of expanding the support to form gaps between wavelength conversion members.

FIG. 8 is a cross-sectional view for illustrating the step of expanding the support to form gaps between wavelength conversion members.

FIG. 9 is a cross-sectional view showing a wavelength conversion member according to a first embodiment of the present invention.

FIG. 10 is a plan view showing the wavelength conversion member according to the first embodiment of the present invention.

FIG. 11 is a plan view for illustrating a missing portion in the periphery of a first principal surface of the wavelength conversion member according to the first embodiment of the present invention.

FIG. 12 is a cross-sectional view showing a light-emitting device in which the wavelength conversion member according to the first embodiment of the present invention is used.

FIG. 13 is a plan view showing the light-emitting device in which the wavelength conversion member according to the first embodiment of the present invention is used.

FIG. 14 is an enlarged cross-sectional view for illustrating an effect exerted on the light extraction efficiency of the wavelength conversion member by the missing portion in the periphery of the first principal surface of the wavelength conversion member.

FIG. 15 is a cross-sectional view showing a wavelength conversion member according to a second embodiment of the present invention.

FIG. 16 is a cross-sectional view showing on an enlarged scale a side surface of the wavelength conversion member according to the second embodiment of the present invention.

FIG. 17 is a cross-sectional view showing, in a light-emitting device using the wavelength conversion member according to the second embodiment of the present invention, the interface between the wavelength conversion member and a reflective member on an enlarged scale.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

(Embodiment of Manufacturing Method)

FIG. 1 is a plan view showing a base material in which breaking grooves are formed in one embodiment of a manufacturing method according to the present invention. FIG. 2 is a cross-sectional view showing on an enlarged scale the breaking groove shown in FIG. 1. As shown in FIG. 2, a base material 10 for wavelength conversion members has a first principal surface 11 and a second principal surface 12 opposed to each other. As shown in FIGS. 1 and 2, breaking grooves 13 are formed in the first principal surface 11 of the base material 10. In this embodiment, the breaking grooves 13 are formed in a grid-like pattern as shown in FIG. 1. Therefore, the breaking grooves 13 are formed to extend in a specified direction (x direction) and a direction (y direction) approximately perpendicular to the specified direction. In the manufacturing method according to this embodiment, wavelength conversion members are manufactured by breaking the base material 10 into parts along the breaking grooves 13. Hence, generally, a pattern corresponding to the shape of wavelength conversion members to be finally manufactured is selected as the pattern of the breaking grooves 13.

FIG. 3 is an enlarged cross-sectional view showing the base material in the one embodiment of the manufacturing method according to the present invention. As shown in FIG. 3, the base material 10 includes an inorganic matrix 2 and phosphor particles 3 dispersed in the inorganic matrix 2. In the figures to be described hereinafter other than FIGS. 16 and 17, the representation of the phosphor particles 3 is omitted.

No particular limitation is placed on the type of the phosphor particles 3 so long as they emit fluorescence upon entry of excitation light. A specific example of the type of the phosphor particles 3 is one or more selected from the group consisting of oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, and garnet-based compound phosphor. In using a blue light as the excitation light, for example, a phosphor emitting a green light, a yellow light or a red light as fluorescence can be used. The average particle diameter of the phosphor particles 3 is preferably 1 μm to 50 μm and more preferably 5 μm to 25 μm. If the average particle diameter of the phosphor particles 3 is too small, the luminescence intensity may decrease. On the other hand, if the average particle diameter of the phosphor particles 3 is too large, the luminescent color may be uneven.

The content of the phosphor particles 3 in the base material 10 is preferably not less than 1% by volume, more preferably not less than 1.5% by volume, particularly preferably not less than 2% by volume, preferably not more than 70% by volume, more preferably not more than 50% by volume, and particularly preferably not more than 30% by volume. If the content of the phosphor particles 3 is too small, it is necessary to increase the thickness of the base material 10 in order to obtain a desired luminescent color. This results in increased internal scattering of the resultant wavelength conversion members, which may decrease the light extraction efficiency. On the other hand, if the content of the phosphor particles 3 is too large, it is necessary to decrease the thickness of the base material 10 in order to obtain the desired luminescent color, which may decrease the mechanical strength of the resultant wavelength conversion members.

An example of the inorganic matrix 2 is a glass. No particular limitation is placed on the type of the glass so long as it can be used as a dispersion medium for the phosphor particles 3. For example, a borosilicate-based glass, a phosphate-based glass, a tin-phosphate-based glass or a bismuthate-based glass can be used. Examples of the borosilicate-based glass include those containing, in % by mass, 30 to 85% $SiO_2$, 0 to 30% $Al_2O_3$, 0 to 50% $B_2O_3$, 0 to 10% $Li_2O+Na_2O+K_2O$, and 0 to 50% $MgO+CaO+SrO+BaO$. Examples of the tin-phosphate-based glass include those containing, in % by mole, 30 to 90% SnO and 1 to 70% $P_2O_5$.

The base material 10 may be made of, aside from the above composition, a ceramic, such as a YAG ceramic.

Referring to FIG. 2, the depth d of the breaking grooves 13 is preferably in a range of 0.1% to 20%, more preferably 0.5% to 10% of the thickness t of the base material 10. If the depth d of the breaking grooves 13 is too small, breaking along the breaking grooves 13 may be difficult to achieve. If the depth d of the breaking grooves 13 is too large, the load for forming the breaking grooves 13 becomes too large, so that cracks (lateral cracks) may develop in unintended directions, resulting in failure to break the base material into parts in a direction perpendicular to the principal surfaces.

The width w of the breaking grooves 13 is preferably not less than 0.001 mm, more preferably not less than 0.002 mm, preferably not more than 0.010 mm, and more preferably 0.005 mm. If the width w is too large, missing portions occur during the breaking. If the width w is too small, breaking along the breaking grooves 13 may be difficult to achieve.

The breaking grooves 13 are preferably formed by scribing. A specific method for forming the breaking grooves 13 (scribe lines) can be appropriately selected depending upon the material of the inorganic matrix 2. If the inorganic matrix 2 is a glass, the breaking grooves 13 are preferably formed by a scriber or the like using diamond particles or the like. Alternatively, the breaking grooves 13 may be formed by laser depending upon the material of the inorganic matrix 2.

FIG. 4 is a cross-sectional view showing a state where a support is bonded to the second principal surface of the base material in the one embodiment of the manufacturing method according to the present invention. As shown in FIG. 4, a support 20 is bonded to the second principal surface 12 of the base material 10 having the breaking grooves 13 formed in the first principal surface 11. As shown in FIG. 5, the support 20 includes a film 21 and an adhesive layer 22 formed on the film 21. In this embodiment, the adhesive layer 22 is made of an ultraviolet curable resin. By bonding the adhesive layer 22 to the second principal surface 12, the support 20 is bonded to the base material 10.

FIGS. 6(a) to 6(c) are cross-sectional views for illustrating the step of pressing through the support a region of the base material where the breaking groove is formed, thus breaking the base material. As shown in FIG. 6(a), a pressing member 30 is placed at a position opposite to a breaking groove 13 subject to breaking. The pressing member 30 includes a blade 31. In this embodiment, the breaking groove 13 subject to breaking extends linearly in the y direction. The blade 31 of the pressing member 30 likewise extends linearly in the y direction.

In a state shown in FIG. 6(a), the pressing member 30 is moved upward (in a z direction) to press the region where the breaking groove 13 is formed through the support 20 with the blade 31. Thus, as shown in FIG. 6(b), the base material 10 is broken in the thickness direction (z direction) along the breaking groove 13, so that broken surfaces 14 are formed. After the broken surfaces 14 are formed, as shown in FIG. 6(c), the pressing member 30 is moved downward (in the z direction) to return the base material 10 bent at the portion along the breaking groove 13 to an original position. Next, the pressing member 30 is moved laterally (in the x direction) to place the pressing member 30 below an adjacent breaking groove 13 and then moved upward in the same manner as described above to break the base material 10 in the thickness direction (z direction) along the adjacent breaking groove 13.

When in the above manner the pressing member 30 is moved laterally (in the x direction) from below one breaking groove 13 to below another to place it below each breaking groove 13 and then moved up and down, the base material 10 is broken into parts along a row of breaking grooves 13 arranged side by side in the x direction. Referring to FIG. 1, after the base material 10 is broken into parts along all the row of breaking grooves 13 arranged side by side in the x direction, the base material 10 is broken into parts along the other row of breaking grooves 13 arranged side by side in the y direction, using a pressing member 30 with a blade 31 oriented to extend in the x direction. By breaking the base material 10 into parts along the breaking grooves 13 in the x direction and the y direction in the above manner, the base material 10 is broken into a matrix. Although in the above description the base material 10 is broken into a grid-like pattern using the respective blades 31 extending in the x direction and the y direction, the breaking manner is not limited to this. For example, the base material 10 may be broken into a grid-like pattern by first breaking the base material 10 in the x direction or they direction with a blade 31, then rotating the base material 10 by 90 degrees in an x-y plane while maintaining the orientation of the blade 31, and subsequently breaking the base material 10 in a direction perpendicular to the direction of the first breaking.

FIGS. 7 and 8 are cross-sectional views for illustrating the step of expanding the support to form gaps between wavelength conversion members. As shown in FIG. 7, a push-in member 32 for expanding the support 20 is placed below the base material 10 broken into a matrix (on the side of the support 20 opposite to the base material 10). The push-in member 32 has the shape of a flat plate. A plurality of wavelength conversion members 1 formed by breaking the base material 10 into a matrix are put on top of the support 20. The support 20 is fixed at its ends by a frame 33.

Next, as shown in FIG. 8, the push-in member 32 is moved upward to press a top surface 32a of the push-in member 32 against the support 20 from below and thus make the support 20 bulge upward. Since the position of a peripheral portion of the support 20 is fixed by the frame 33, the support 20 expands laterally (in the x direction and the y direction). By the lateral expansion of the support 20, gaps 15 are formed between the plurality of wavelength conversion members 1 lying on top of the support 20. When in this state the support 20 is irradiated with ultraviolet rays from above, the adhesive layer on the surface of the support 20 is cured, so that the adhesiveness of the adhesive layer decreases. Thus, the wavelength conversion members 1 can be easily removed from the support 20. The plurality of wavelength conversion members 1 are removed from the support 20 using a picking device or other means. By the formation of gaps 15 between the plurality of wavelength conversion members 1, it can be prevented that in removing the wavelength conversion members 1 from the support 20, each wavelength conversion member 1 to be removed makes contact with adjacent wavelength conversion members 1. Thus, it can be prevented that missing portions occur in the side surfaces of the wavelength conversion members 1 owing to chipping or other causes.

By breaking the base material 10 into parts along the breaking grooves 13 in the above manner, a plurality of wavelength conversion members 1 can be manufactured. The method according to this embodiment enables accurate breaking of the base material 10 along the breaking grooves 13. Therefore, the resultant wavelength conversion members 1 tend to have a higher dimensional accuracy in the first principal surfaces than in the second principal surfaces. Hence, in producing a light-emitting device by combining the wavelength conversion member 1 with a light source, it is preferred to produce it so that the first principal surface of the wavelength conversion member 1 serves as a light outgoing surface.

Although in this embodiment breaking grooves having a grid-like pattern are formed and a plurality of wavelength conversion members having a rectangular plan shape are manufactured, the present invention is not limited to this. For example, the plan shape of the wavelength conversion members may be triangular or polygonal, such as pentagonal or hexagonal. Alternatively, the plan shape may be circular, oval or like shapes. Still alternatively, the plan shape may be a shape partly including an arc.

Although in this embodiment breaking grooves are formed only in the first principal surface of the base material, breaking grooves may also be formed in the second principal surface. Although in this embodiment the support is expanded by pressing the support from below to make it bulge upward, the present invention is not limited to this. Other means for expanding the support laterally may be used. Although the support used is a support on which an adhesive layer made of an ultraviolet curable resin is formed, the present invention is not limited to this.

(Wavelength Conversion Member and Light-Emitting Device of First Embodiment)

FIG. 9 is a cross-sectional view showing a wavelength conversion member according to a first embodiment of the present invention, and FIG. 10 is a plan view showing the wavelength conversion member according to the first embodiment of the present invention. A wavelength conversion member 1 shown in FIGS. 9 and 10 is a wavelength conversion member manufactured by the method according to the above embodiment. The wavelength conversion member 1 has a first principal surface 4 corresponding to the first principal surface 11 of the base material 10 and a second principal surface 5 corresponding to the second principal surface 12 of the base material 10. Therefore, the first principal surface 4 and the second principal surface 5 are opposed to each other. Furthermore, as shown in FIG. 3, the wavelength conversion member 1 includes an inorganic matrix 2 and phosphor particles 3 dispersed in the inorganic matrix 2. The wavelength conversion member 1 has side surfaces 7 connecting between the first principal surface 4 and the second principal surface 5 and the side surfaces 7 correspond to the broken surfaces 14.

Since the wavelength conversion member 1 according to this embodiment is a wavelength conversion member manufactured by the method according to the above embodiment, the scribe lines are formed along the periphery 6 of the first principal surface 4. The wavelength conversion member 1 according to this embodiment has less missing portions in the periphery 6 of the first principal surface 4 as compared to a conventional wavelength conversion member produced by dicing. Since as described previously the width w of the breaking grooves 13 is smaller than a missing portion in the present invention to be described below, the effect exerted on the light extraction efficiency of the wavelength conversion member 1 by the breaking grooves 13 is small.

A description will be given below of the effect exerted on the light extraction efficiency of the wavelength conversion member 1 by a missing portion in the periphery 6 of the first principal surface 4.

FIG. 11 is a plan view for illustrating a missing portion in the periphery 6 of the first principal surface 4 of the wavelength conversion member 1. The periphery 6 shown in FIG. 11 is a portion extending linearly in they direction. Therefore, a first imaginary line A can be assumed which adjoins an outermost portion 6*a* located outermost of the periphery 6 and extends linearly in the y direction. As shown in FIG. 11, a second imaginary line B is also assumed which extends in parallel with the first imaginary line A and is located a distance D inwardly of the first imaginary line A. In the present invention, the distance D is 0.01 mm.

In the present invention, portions of the periphery 6 located inwardly of the second imaginary line(s) B are assumed as missing portions 6*b*. The present invention has a feature that the missing portions 6*b* make up 10% or less of the entire periphery 6. This means that the sum of the lengths L of the missing portions 6*b* along the second imaginary line(s) B throughout the entire periphery 6 is 10% or less of the total length of the first imaginary line(s) A along the periphery 6. To be specific about the wavelength conversion member 1 according to this embodiment, the plan shape of the wavelength conversion member 1 is rectangular and formed of four sides. The length of the first imaginary line A and the lengths L of missing portions 6*b* are measured for each side of the rectangular shape, the sum of the lengths of the first imaginary lines A of the four sides and the sum of the lengths L of the missing portions 6*b* of the four sides are determined, and determination is made of whether or not the sum of the lengths L is 10% or less of the sum of the lengths of the first imaginary lines A.

So long as the plan shape of the wavelength conversion member 1 is composed of linear line segments, the lengths L of the missing portions 6 can be measured in the same manner as described above. If the plan shape of the wavelength conversion member 1 includes any arcuate portion, an arcuate first imaginary line A is assumed and an arcuate second imaginary line B located concentrically inwardly of the first imaginary line A is assumed. Thus, the lengths L of missing portions 6*b* can be measured in the same manner as described above. In this case, the second imaginary line B is set a distance D radially inwardly of the first imaginary line A.

Since, according to the present invention, the missing portions 6*b* make up 10% or less of the entire periphery 6, the light extraction efficiency of the wavelength conversion member 1 can be increased. This will be described below.

FIG. 12 is a cross-sectional view showing a light-emitting device in which the wavelength conversion member according to the first embodiment of the present invention is used. FIG. 13 is a plan view thereof. As shown in FIGS. 12 and 13, a light-emitting device 50 according to this embodiment includes the wavelength conversion member 1 and a light source 51 capable of irradiating the wavelength conversion member 1 with excitation light. The light source 51 is provided below the wavelength conversion member 1. The light-emitting device 50 further includes a substrate 61 and the light source 51 is provided between the substrate 61 and the wavelength conversion member 1. A reflective member 41 is provided around the wavelength conversion member 1 and the light source 51.

Examples of the reflective member 41 that can be used include a resin composition containing a resin and a ceramic powder and a glass ceramic. Examples of a material for the glass ceramic that can be used include a mixed powder of glass powder and ceramic powder and a crystallizable glass powder.

Examples of the glass powder that can be used include $SiO_2$—$B_2O_3$-based glasses, $SiO_2$—RO-based glasses (where R represents an alkaline earth metal), $SiO_2$—$Al_2O_3$-based glasses, $SiO_2$—ZnO-based glasses, $SiO_2$—$R_2O$-based glasses (where R represents an alkali metal), and $SiO_2$—$TiO_2$-based glasses. These glass powders may be used alone or in a combination of two or more of them.

Examples of the ceramic powder that can be used include silica, alumina, zirconia, and titania. These ceramic powders may be used alone or in a combination of two or more of them.

The reflective member 41 is particularly preferably made of a white resin composition containing a white pigment. Examples of the white pigment include ceramic powders of silica, alumina, zirconia, and titania as described above.

Examples of the light source 51 that can be used include an LED (light emitting diode) and an LD (laser diode).

Examples of the substrate 61 that can be used include white LTCCs (low temperature co-fired ceramics) capable of efficiently reflecting light emitted from the light source 51. A specific example of the white LTCC is a sintered body of an inorganic powder, such as aluminum oxide, titanium oxide or niobium oxide, and a glass powder. Alternatively, ceramics, including aluminum oxide and aluminum nitride, can also be used as the substrate 61.

Excitation light emitted from the light source 51 excites phosphor particles in the wavelength conversion member 1, so that fluorescence is emitted from the phosphor particles. A synthesized light of this fluorescence and excitation light having passed through the wavelength conversion member 1 is emitted from the light-emitting device 50.

FIG. 14 is an enlarged cross-sectional view for illustrating an effect exerted on the light extraction efficiency of the wavelength conversion member by a missing portion in the periphery of the first principal surface of the wavelength conversion member. FIG. 14 shows on an enlarged scale the interface between the wavelength conversion member 1 and the reflective member 41. If there is a missing portion 6b in the periphery 6 of the wavelength conversion member 1, the reflective member 41 surrounding the wavelength conversion member 1 is likely to enter the missing portion 6b as shown in FIG. 14. Therefore, light emitted from the wavelength conversion member 1 is reflected on the above portion and the reflected light is not emitted from the wavelength conversion member 1. Thus, the light extraction efficiency of the wavelength conversion member 1 decreases. Since, according to the present invention, the missing portions 6b in the periphery 6 of the first principal surface of the wavelength conversion member 1 make up 10% or less of the entire periphery 6, the light extraction efficiency of the wavelength conversion member 1 can be improved. The missing portions 6b preferably make up 5% or less of the entire periphery 6 and more preferably make up 3% or less of the entire periphery 6.

Example 1 and Comparative Example 1

Respective wavelength conversion members having a plan shape of a 1.4 mm×1.4 mm rectangle and a thickness of 0.2 mm were produced by a method for manufacturing wavelength conversion members by breaking a base material into parts in the breaking manner according to the present invention (Example 1) and a method for manufacturing wavelength conversion members by breaking a base material into parts using a dicing saw (Comparative Example 1). YAG:Ce was used as phosphor particles, an alkaline earth silicate glass was used as an inorganic matrix, and the content of phosphor particles in a base material was 10% by volume.

Example 1

Breaking grooves were formed in the first principal surface of the base material to a depth d of 0.004 mm and a width w of 0.004 mm and the base material was then broken into parts by the method according to the present invention, thus obtaining wavelength conversion members. Missing portions in the periphery of the first principal surface of the obtained wavelength conversion member made up 3% of the entire periphery.

The obtained wavelength conversion member and a light source was adhesively bonded with a transparent silicone resin by curing the resin and a reflective member was then provided on the side surfaces of the wavelength conversion member and the light source, thus producing a light-emitting device. The reflective member was produced using a white resin composition made of silicone resin and titania powder. A flip-chip LED having a wavelength of 445 nm was used as the light source. The obtained light-emitting device was irradiated with excitation light (having a current value of 0.3 A) from the light source and the luminous flux of light emitted from the light-emitting device was measured. The luminous flux was 105 a.u.

Comparative Example 1

Wavelength conversion members were obtained in the same manner as in Example 1 except that the base material was broken into parts by cutting with a dicing saw. The dicing saw used was a dicing saw having a blade width of 0.1 mm. When cutting the base material, portions of the base material corresponding the blade width of the dicing saw were chipped away, resulting in a material loss of about 14%. Missing portions in the periphery of the first principal surface of the obtained wavelength conversion member made up 20% of the entire periphery.

In the same manner as in Example 1, a light-emitting device was produced and the luminous flux of light emitted from the light-emitting device was measured. The luminous flux was 100 a.u.

Comparison between Example 1 and Comparative Example 1 shows that by suppressing the occurrence of missing portions in the periphery to 10% or less of the entire periphery according to the present invention, the light extraction efficiency of the wavelength conversion member can be improved.

Although the wavelength conversion member shown in FIGS. 9 and 10 includes an inorganic matrix 2 and phosphor particles 3 dispersed in the inorganic matrix 2, the first embodiment is not limited to this structure. For example, a wavelength conversion member may be entirely made of a phosphor, like a phosphor ceramic.

(Wavelength Conversion Member and Light-Emitting Device of Second Embodiment)

FIG. 15 is a cross-sectional view showing a wavelength conversion member according to a second embodiment of the present invention. A wavelength conversion member 1 shown in FIG. 15 is a wavelength conversion member manufactured by the method according to the above embodiment. The wavelength conversion member 1 has a first principal surface 4 corresponding to the first principal surface 11 of the base material 10 and a second principal surface 5 corresponding to the second principal surface 12 of the base material 10. Therefore, the first principal surface 4 and the second principal surface 5 are opposed to each other. Furthermore, as shown in FIG. 3, the wavelength conversion member 1 includes an inorganic matrix 2 and phosphor particles 3 dispersed in the inorganic matrix 2. The wavelength conversion member 1 has side surfaces 7 connecting between the first principal surface 4 and the second principal surface 5 and the side surfaces 7 correspond to the broken surfaces 14.

The side surfaces 7 of the wavelength conversion member 1 according to this embodiment are surfaces formed by breaking the base material in the manner described above. When the base material is broken, the inorganic matrix 2 is broken, but phosphor particles 3 present in the broken surfaces are not broken. Therefore, as shown in FIG. 16, convex portions 8 are formed by the phosphor particles on the side surfaces 7 each formed of a broken surface.

FIG. 17 is a cross-sectional view showing, in a light-emitting device using the wavelength conversion member according to the second embodiment of the present invention, the interface between the wavelength conversion member and a reflective member on an enlarged scale. As shown in FIG. 17, the convex portions 8 formed by phosphor particles are placed to wedge in the reflective member 41. Therefore, the convex portions 8 formed by phosphor particles exert an anchoring effect on the reflective member 41. With on-off control of the light source, the light-emitting device repeats temperature rise and drop, and expands and contracts according to its temperature cycle. Even in this situation, the peeling of the reflective member 41 can be prevented by the anchoring effect of the convex portions 8.

REFERENCE SIGNS LIST

1 . . . wavelength conversion member
2 . . . inorganic matrix
3 . . . phosphor particle
4 . . . first principal surface
5 . . . second principal surface
6 . . . periphery
6a . . . outermost portion
6b . . . missing portion
7 . . . side surface
8 . . . convex portion
10 . . . base material
11 . . . first principal surface
12 . . . second principal surface
13 . . . breaking groove
14 . . . broken surface
15 . . . gap
20 . . . support
21 . . . film
22 . . . adhesive layer
30 . . . pressing member
31 . . . blade
32 . . . push-in member
32a . . . top surface
33 . . . frame
41 . . . reflective member
50 . . . light-emitting device
51 . . . light source
61 . . . substrate
d . . . depth of breaking groove
w . . . width of breaking groove
D . . . distance between first imaginary line and second imaginary line
L . . . length of missing portion

The invention claimed is:

1. A wavelength conversion member having:
   a first principal surface and a second principal surface on opposite sides of the wavelength conversion member, wherein
   the wavelength conversion member has a scribe line formed on a periphery of the first principal surface, and
   the scribe line has a depth from 0.1% to 20% of a thickness of the wavelength conversion member.

2. The wavelength conversion member according to claim 1, wherein a missing portion in a periphery of the first principal surface makes up 10% or less of the entire periphery.

3. The wavelength conversion member according to claim 1, wherein phosphor particles are dispersed in an inorganic matrix.

4. The wavelength conversion member according to claim 3, wherein the inorganic matrix is a glass.

5. A light-emitting device comprising:
   the wavelength conversion member according to claim 1;
   a light source provided toward the second principal surface of the wavelength conversion member and capable of irradiating the wavelength conversion member with excitation light; and
   a reflective member provided around a side surface of the wavelength conversion member connecting between the first principal surface and the second principal surface.

6. The light-emitting device according to claim 5, wherein the reflective member is made of a resin containing a white pigment.

7. A wavelength conversion member having a first principal surface and a second principal surface on opposite sides of the wavelength conversion member and containing phosphor particles dispersed in an inorganic matrix,
   wherein a convex portion is formed by the phosphor particle on a side surface of the wavelength conversion member connecting between the first principal surface and the second principal surface.

* * * * *